United States Patent [19]

Fujishima et al.

[11] 4,305,158

[45] Dec. 8, 1981

[54] TELEVISION TUNER

[75] Inventors: Satoru Fujishima, Muko; Fumio Nakayama, Kyoto, both of Japan

[73] Assignee: Murata Manufacturing Co., Ltd., Kyoto, Japan

[21] Appl. No.: 97,658

[22] Filed: Nov. 27, 1979

Related U.S. Application Data

[63] Continuation of Ser. No. 888,239, Mar. 20, 1978, abandoned.

[30] Foreign Application Priority Data

Mar. 31, 1977 [JP] Japan .................................. 52/38005

[51] Int. Cl.$^3$ .............................................. H04B 1/16
[52] U.S. Cl. .................................... 455/187; 455/199
[58] Field of Search ............... 455/178, 179, 180, 187, 455/196, 197, 198, 199; 333/193; 331/107 A, 155; 358/191.1

[56] References Cited

U.S. PATENT DOCUMENTS

| | | | |
|---|---|---|---|
| 3,264,566 | 8/1966 | Kaufman et al. | 455/187 |
| 3,555,431 | 1/1971 | Wilcox | 455/187 |
| 3,602,823 | 8/1971 | Carter | 455/187 |
| 3,757,260 | 9/1973 | Fujita | 455/187 |
| 3,766,496 | 10/1973 | Whitehouse | 331/155 |
| 3,798,463 | 3/1974 | Ikeguchi et al. | 455/179 |
| 3,831,116 | 8/1974 | Davis, Jr. et al. | 333/193 |

*Primary Examiner*—Jin F. Ng

*Attorney, Agent, or Firm*—Birch, Stewart, Kolasch & Birch

[57] ABSTRACT

A television tuner comprises a high frequency amplifier for receiving a high frequency signal received by an antenna, a local oscillator, and a mixer for mixing the high frequency signal from the high frequency amplifier and the oscillation frequency signal from the local oscillator for providing an intermediate frequency signal. The high frequency amplifier comprises a high frequency amplifying transistor, and a group of acoustic surface wave filter elements each exhibiting a high band pass characteristic corresponding to each of the television channels. The output of each filter in the filter group is transferred to the mixer through a corresponding switching device among a corresponding plurality of semconductor switching devices individually coupled between the corresponding output terminals of the filters and the ground by turning off the semiconductor switching device corresponding to a desired channel and turning on the remaining switching devices. These semiconductor switching devices are adapted to be on/off controlled individually in response to corresponding flip-flops adapted to be selectively set in response to a channel selection switch. The local oscillator comprises another group of acoustic surface wave resonators each exhibiting a resonance characteristic corresponding to a channel and a feedback loop. The respective resonators are selectively enabled or disabled by means of a corresponding plurality of semiconductor switching devices in the same manner as done in the above described filters.

21 Claims, 8 Drawing Figures

TELEVISION TUNER

This application is a continuation of copending application Ser. No. 888,239, filed on Mar. 20, 1978 now abandoned.

BACKGROUND OF THE INVENTION

1. Field of the Invention

The present invention relates to a television tuner. More specifically, the present invention relates to a television tuner employing an acoustic surface wave device in either or both of a high frequency amplifier and a local oscillator.

2. Description of the Prior Art

FIGS. 1 and 2 each show a schematic diagram of a typical conventional television tuner. Each tuner comprises at least a high frequency amplifier RFA, a local oscillator OSC and a mixer MIX. The high frequency amplifier and the local oscillator are structured such that a high frequency and a local oscillation frequency corresponding to any desired television channel may be tuned by tuning circuits in the high frequency amplifier and the local oscillator, whereby any desired channel is received. Referring to FIGS. 1 and 2, the high frequency amplifier RFA is shown comprising a high frequency amplifying transistor TR1, the local oscillator OSC is shown comprising a local oscillating transistor Tr2, and the mixer is shown comprising a mixing transistor Tr3. A tuner thus structured comprises tuning circuits T1 and T2 in the high frequency amplifier RFA and a tuning circuit T3 in the local oscillator OSC, structured to be selectively tuned to the high frequency and the local oscillation frequency corresponding to the desired channel.

FIG. 1 shows a schematic diagram of a tuner of a well known mechanical switching scheme, wherein each of the above described three tuning circuits T1, T2 and T3 comprises a multiplicity of coil segments, totaling three times the number of channels. In such a mechanical switching scheme, the coil segments are coupled to a mechanical switching apparatus, such as a rotary switch, turret switch, and the like, such that desired coil segments are selectively switched to attain tuning frequencies corresponding to a desired television channel. Therefore, such a tuner employing a mechanical switching scheme requires an increased number of coil segments to cover all the television channels. Another problem is caused that the tuner suffers from poor contact in a mechanical switching scheme because of air pollution, mechanical wear and the like, resulting in a reduced life time and a noise. Since a multiplicity of coil segments are required, a tuner becomes large sized and the structure becomes complicated. Furthermore, frequency alignment is required for each channel, which degrades productivity of such a tuner from the practical point of view.

On the other hand, in order to eliminate the above described shortcomings in such a tuner employing a mechanical switching scheme, there has been proposed an electronic tuner basically comprising tuning circuits T1, T2 and T3 each employing a voltage controlled variable capacitance diode, as shown in FIG. 2. FIG. 3 shows an equivalent diagram of each tuning circuit T1, T2 or T3 shown in FIG. 2.

Referring to FIGS. 2 and 3, the tuning frequency of each tuning circuit T1, T2 or T3 is adapted to be variable through the variation of capacitance across a voltage controlled variable capacitance diode Vd. The capacitance of this diode is variable as a function of a reverse bias voltage applied thereacross by way of a tuning voltage. Accordingly, such an electronic tuner requires a tuning voltage which is changed in a stepwise manner so as to correspond to each television channel for the purpose of selection of a desired television channel. Generation of a tuning voltage changeable in a number of steps, however, requires a complicated circuit. In addition, maintaining the tuning frequency at a prescribed value in order to attain a screen image of high quality and thus maintaining a tuning voltage at an exact value further makes the circuit complicated. However, a voltage fluctuation cannot be avoided despite a circuit of high quality, this voltage fluctuation gives rise to a frequency fluctuation. A voltage controlled variable capacitance diode is subject to a time dependent change of capacitance characteristic, requiring the readjustment of the tuning voltage generator. Such an electronic tuner further necessitates a complicated circuit for providing a band switching voltage for selecting a UHF or VHF band, or selecting a high or low band in the VHF band. As well known, a television tuner has to meet the requirement of a high selectivity characteristic wherein a signal having a band width of several MHz is received with fidelity while other extraneous signals are removed. However, the the quality factor Q of a voltage controlled variable capacitance diode VD makes if difficult to increase the quality factor Q of an electronic tuner.

The present invention is aimed to eliminate the above described shortcomings in a conventional tuner by employing an acoustic surface wave filter. In this context, a tuner of interest is seen in U.S. Pat. No. 3,858,118 issued Dec. 31, 1974 to Michael R. Daniel. The referenced patent merely discloses and claims a television tuner employing acoustic surface wave filters in place of conventional tuning circuits implemented by a coil and a capacitor. Thus, the referenced patent does not contemplate any improved channel selecting scheme suited for selection of acoustic surface wave filters, inasmuch as the referenced patent merely shows a diagram of a mechanical switching scheme for selection of acoustic surface wave filters. Thus, there is still room for improvement in channel selection in such a television tuner employing acoustic surface wave filters.

SUMMARY OF THE INVENTION

According to the present invention, an acoustic surface wave apparatus is employed in either or both of a high frequency amplifier and a local oscillator in a television tuner comprising a high frequency amplifier, a local oscillator and a mixer. An acoustic surface wave apparatus comprises a plurality of interdigital transducers the number of which corresponds to the television channel number, each transducer having a band pass characteristic associated with a corresponding channel frequency. The inventive tuner further comprises a set of semiconductor switching devices for each acoustic surface wave apparatus, adapted to be on/off controlled responsive to a selective operation of a channel selection means, whereby a corresponding transducer is selectively enabled to select a desired channel. The semiconductor switching devices are provided so as to individually correspond to the television channels. Preferably, the semiconductor switching devices are provided such that those corresponding to the channels not selected disable the corresponding interdigital transducers.

Accordingly, a principal object of the present invention is to provide a television tuner employing an acoustic surface wave apparatus, wherein channel selection is achieved by means including an improved circuit configuration of an electronic switching means.

Another object of the present invention is to provide a television tuner employing an acoustic surface wave apparatus, wherein an electronic switching means of a simplified structure is employed for channel selection without necessity of any complicated additional circuit.

A further object of the present invention is to provide a television tuner suited for solid state implementation.

Still a further object of the present invention is to provide a television tuner suited for mass production in a reduced size.

These objects and other objects, features, aspects and advantages of the present invention will become more apparent from the following detailed description of the present invention when taken in conjunction with the acompanying drawings.

DESCRIPTION OF THE PREFERRED EMBODIMENTS

Figure 4:
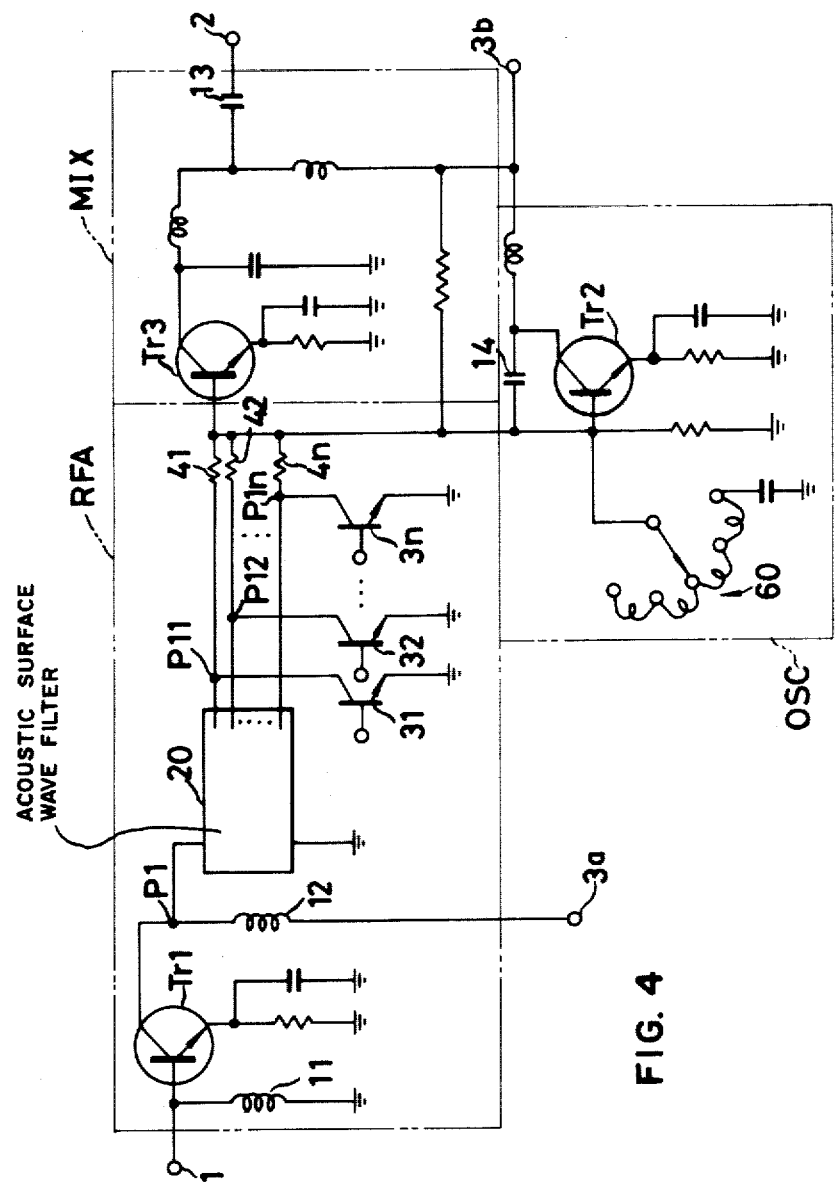
FIG. 4 shows a schematic diagram of one embodiment of the present invention.

FIG. 4 shows a schematic diagram of one embodiment of the present invention. Referring to the figure, a high frequency signal received through a terminal 1 from an antenna, not shown, is applied to a high frequency amplifier RFA. The output from the high frequency amplifier RFA is applied to a mixer MIX, which also receives the output from a local oscillator OSC and mixes these outputs to provide an intermediate frequency signal at a terminal 2. The high frequency amplifier RFA, the local oscillator OSC and the mixer MIX are each implemented by transistors Tr1, Tr2 and Tr3, respectively. A bias voltage is applied through terminals 3a and 3b to the transistors Tr1, Tr2 and Tr3, as shown in the figure.

The above described terminal 1 is coupled to the base electrode of the high frequency amplifying transistor Tr1, while the base electrode is grounded through a biasing coil 11. The coil 11 may be replaced by a resistor, although a coil is preferred from the standpoint of signal to noise ratio, bias voltage stability and automatic gain control. The coil 11 may also be utilized to constitute a high frequency tuning circuit. The emitter electrode of the transistor Tr1 is grounded through a parallel connection of a resistor and a capacitor. The collector electrode of the transistor Tr1 is coupled to an input terminal P1 of an acoustic surface wave apparatus 20. The collector electrode of the transistor Tr1 is also connected to the above described terminal 3a through a coil 12 for input impedance matching of the acoustic surface wave apparatus 20. It has been observed that placing of the acoustic surface wave apparatus 20 at the stage subsequent to the high frequency amplifying transistor Tr1 improves a signal to noise ratio, as compared with placing of the acoustic surface wave apparatus 20 at the stage before the high frequency amplifying transistor Tr1. The reason is that normally an acoustic surface wave filter is subject to an insertion loss of a few dB and therefore selection of a desired signal by the use of an acoustic surface wave filter after the same is amplified by the high frequency transistor Tr1 enhances a signal to noise ratio. It is pointed out that such an insertion loss is 6dB at the least and in actuality approximately 10dB in case of a bidirectional transducer, approximately 3dB in case of a unidirectional transducer at either an input side or output side, and in actuality one to two dB even in case of unidirectional transducer both at the input and output sides.

Figure 5:
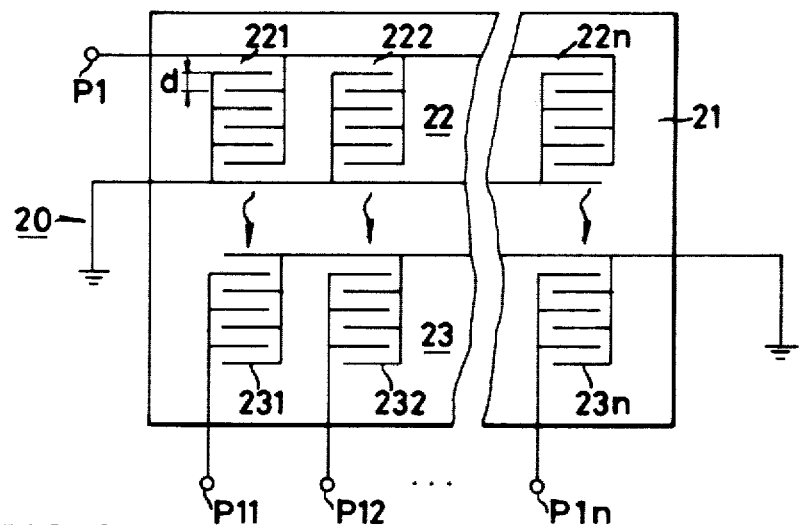
FIG. 5 shows a schematic diagram of an acoustic surface wave apparatus for use in the present invention.

The acoustic surface wave filter or apparatus 20 is structured as shown in FIG. 5, for example. Referring to FIG. 5, the acoustic surface wave apparatus 20 will be described in more detail. The apparatus 20 comprises a piezoelectric body 21 made of a piezoelectric thin film of such as ZnO, a single crystal of quartz, LiNbO$_3$, or the piezoelectric ceramic of such as PZT. The piezoelectric body 21 is provided with input side interdigital transducers 22 of the number corresponding to the television channel number (n) and output side interdigital transducers 23 so as to individually correspond to the input side interdigital transducers 22. One of each pair of comb shaped and interdigitated electrodes 221, 222, 223, . . . 22n of the input side transducer 22 is commonly connected to an input terminal P1, while the other of each pair of comb shaped and interdigitated electrodes 221, 222, 223, . . . 22n of the input side transducer 22 is commonly connected to the ground. One of each pair of comb shaped and interdigitated electrodes 231, 232, 233, . . . 23n of the output side transducer 23 is individually connected to output terminals P11, P12, P13, . . . P1n, respectively, while the other of each pair of comb shaped and interdigitated electrodes 231, 232, 233, . . . 23n is commonly grounded. The respective electrodes 23 of the output side transducer are arranged at the position where an acoustic surface wave sent from the respective electrodes of the corresponding input side transducer 22 is received, i.e. on the propagation path of an acoustic surface wave sent from the respective electrodes of the corresponding input side transducers 22. An electrode pattern of the input side transducer 22 and the output side transducer 23 may be determined as described in the following. For example, the center to center spacing d between ajacent electrode fingers of the first input and output electrodes 221 and 231, for example, is selected to correspond to the first channel frequency, while the number of electrode finger pairs is determined to coincide with a prescribed band pass width. The second and further electrodes 222, 223, . . . 2n; 232, 233, . . . 23n are also determined so as to correspond to the channel frequencies and the prescribed band pass width. As a result, a group of transducers comprising the respective input electrodes and the corresponding output electrodes each have a corresponding band pass characteristic.

The output terminals P11, P12, P13, . . . P1n corresponding to the respective television channels of the acoustic surface wave apparatus 20 are coupled to the base electrodes of the mixing transistor Tr3 in a wired OR manner through corresponding resistors 41, 42, 43, . . . 40n, respectively. The output terminals P11, P12, P13, . . . P1n are also grounded through corresponding semiconductor switching devices 31, 32, 33, . . . 3n, respectively. The semiconductor switching devices 31, 32, 33, . . . 3n each may be a transistor, the control electrode or the base electrode of which is connected to receive a switching signal of a channel selection circuit 80 shown in FIG. 6 and to be described subsequently. The semiconductor switching devices 31, 32, 33, . . . 3n each may alternatively be a PIN diode, thyristor, or like. Preferably, such semiconductor switching devices 31, 32, 33, . . . 3n exhibit a high impedance in the vicinity of a prescribed frequency on the occasion of turning off. Preferably, these semiconductor switching devices 31, 32, 33, . . . 3n are connected such that one corresponding to a desired television channel is turned off, while the remaining switching devices are turned on. The signal as received of a desired channel is transferred to the base electrode of the transistor Tr3 of the mixer MIX without a substantial loss because of a high impedance of such a switching device when the same is turned off, while undesired signals in other switching devices are allowed to be by-passed to the ground through the switching devices now in conduction so that these undesired signals may not be transferred to the mixer MIX. Therefore, attenuation of such undesired signals is extremely large.

Although in the embodiment shown, the semiconductor switching devices 31, 32, 33, . . . 3n have been coupled in parallel between the respective output terminals P11, P12, P13, . . . P1n and the ground, these semiconductor switching devices 31, 32, 33, . . . 3n may be inserted in series between the respective output terminals P11, P12, P13, . . . P1n and the base electrode of the transistor Tr3. It is pointed out that in case where these semiconductor switching devices are coupled in parallel as done in the embodiment shown, it is necessary to connect series resistors 41, 42, 43, . . . 4n in the respective transfer paths. The reason is that without such resistors 41, 42, 43, . . . 4n, grounding of any one of the output terminals P11, P12, P13, . . . P1n corresponding to a desired channel through turning on of the corresponding switching device would ground the remaining output terminals by virtue of a common connection at the output side. Thus, only a high frequency signal of a desired channel is applied from the high frequency amplifier RFA to the mixer transistor Tr3.

Figure 1:
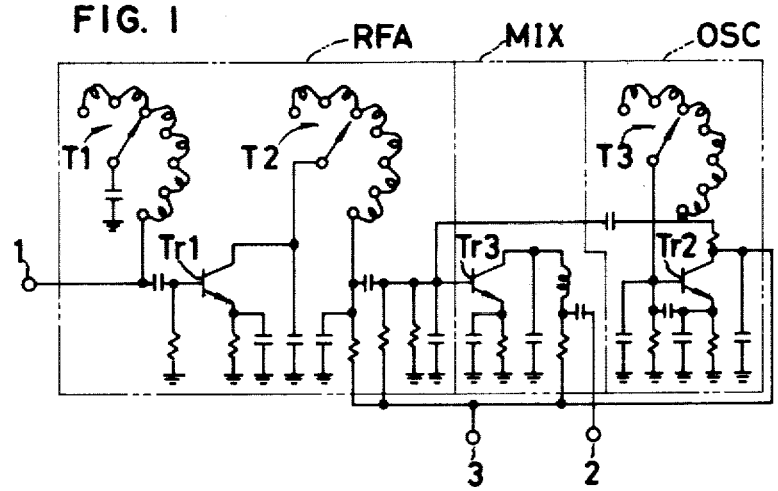
FIGS. 1 and 2 each show a schematic diagram of an example of a prior art television tuner of interest.

On the other hand, the mixing transistor Tr3 is further supplied with a local oscillation signal from the local oscillator OSC together with the signal received from the above described filter, whereupon both signals are mixed up in the mixer MIX to provide an intermediate frequency signal at the terminal 2. The local oscillator OSC is shown comprising a feedback capacitor 14, and oscillation coil segments 60, which is similar to that as denoted as T2 in FIG. 1.

Figure 6:
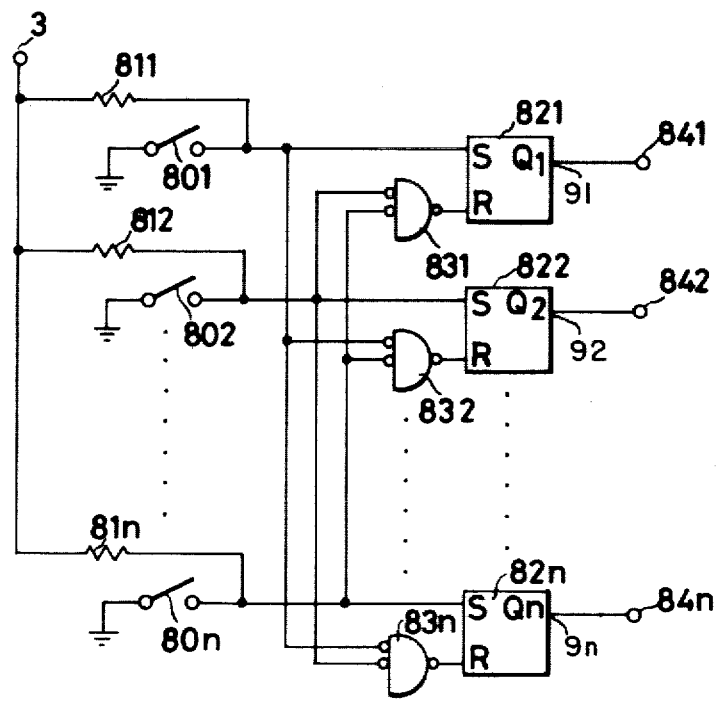
FIG. 6 shows a schematic diagram of an example of an electronic switching means for use in the present invention.

FIG. 6 shows in more detail a preferred embodiment of a channel selection circuit. The channel selection circuit 80 comprises switches 801, 802, 803, . . . 80n of the number corresponding to the television channel number (n). The switches 801, 802, 803, . . . 80n each may be a so called touch switch, but alternatively may be a pure mechanical switch. One end of each of these switches 801, 802, 803, . . . 80n is commonly connected to the ground, while the other end of each of the switches 801, 802, 803, . . . 80n is connected to the set input of each of the corresponding flip-flops 821, 822, 823, . . . 82n, respectively. The set input of each of the flip-flops 821, 822, 823, . . . 82n is connected through corresponding resistors 811, 812, 813, . . . 81n to a bias terminal 3. The other end of each of the switches 801, 802, 803, . . . 80n is also coupled to OR gates 831, 832, 833, . . . 83n other than that corresponding to self. Each of the outputs of the OR gates 831, 832, 833, . . . 83n is connected to the reset input of each of the flip-flops 821, 822, 823, . . . 82n. Each of non-inverted outputs 91, 92, 93, . . . 9n of the flip-flops 821, 822, 823, . . . 82n, respectively, is withdrawn through each of individual terminals 841, 842, 843, . . . 84n, respectively, and is applied to the control gate of each of the semiconductor switching devices 31, 32, 33, . . . 3n and semiconductor switching devices 61, 62, 63, . . . 6n to be described subsequently with reference to FIG. 7.

In operation, when a main switch, not shown, of a television receiver is turned on, the bias voltage is applied to the bias terminal 3. Accordingly, a set signal is applied to each of the flip-flops 821, 822, 823, . . . 82n through each of the resistors 811, 812, 813, . . . 81n, respectively, and a high level switching voltage is obtained at each of the terminals 841, 842, 843, . . . 84n, respectively. Therefore, all the semiconductor switching devices 31, 32, 33, . . . 3n shown in FIG. 4 are turned on. Accordingly, all the output terminals P11, P12, P13, . . . P1n of the acoustic surface wave apparatus 20 are grounded and no reception signal is applied to the base electrode of the mixing transistor Tr3.

Now a case where channel No. 1 is to be selected as a desired channel will be described in the following. It is pointed out that the description in conjunction with channel No. 1 will be equally applicable to selection of other channels. In order to select channel No. 1, the switch 801 is turned on. Accordingly, the set input of the flip-flop 821 becomes the low level and the output of the OR gate 831 and thus the reset input becomes the high level. Therefore, the flip-flop 821 is reset, whereby the output Q1 and thus the terminal 841 becomes the low level. As a result, the switching device 31 corresponding to channel No. 1 is turned off. At that time, the remaining channel selecting switches 802 through 80n remains off and thus the flip-flops 822 through 82n remains set. Accordingly, the semiconductor switching devices 32 through 3n remains on. Therefore, as described above, only the signal for channel No. 1 is transferred through the resistor 41 from the output terminal P11 of the acoustic surface wave apparatus 20 to the transistor Tr3 of the mixer MIX. Thus, the embodiment shown of the channel selection circuit 80 for use in the present invention can employ existing flip-flops, OR gates and the like which are easy to implement in an integrated circuit, with the result that a television tuner of economy and reliability is provided.

Now the operation of the embodiment shown in FIG. 4 will be described. The signal as received through the terminal 1 from the antenna is amplified by the high frequency amplifying transistor Tr1 and thereafter is applied to the acoustic surface wave apparatus 20. When a switch corresponding to a desired channel is turned on in the channel selection circuit 80, the corresponding semiconductor switching device 30 is turned off, whereby only the signal of the desired channel among the signals obtainable from the acoustic surface wave apparatus 20 is selectively transferred to the transistor Tr3. On the other hand, the local oscillation signal of a predetermined frequency obtainable from the local oscillator OSC is also applied to the base electrode of the transistor Tr3 of the mixer MIX, where the above described signals are mixed up to provide an intermediate frequency signal at the terminal 2.

Figure 2:
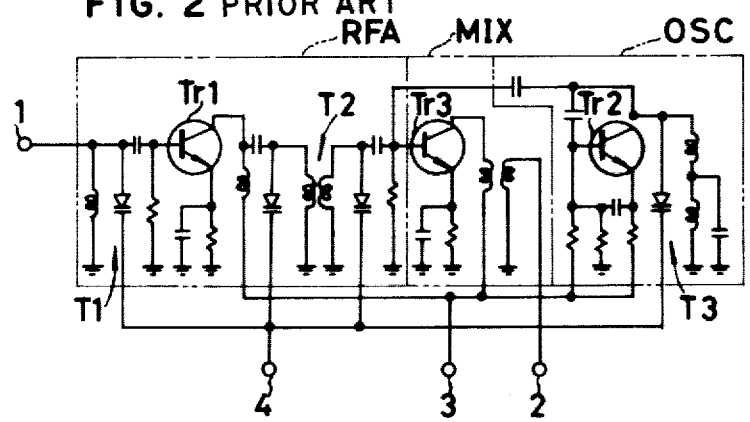
Figure 3:
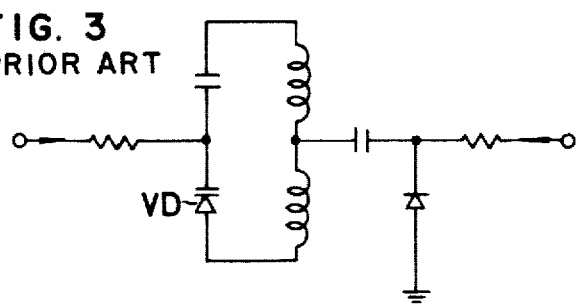
FIG. 3 shows an equivalent diagram of a tuning circuit in a conventional television tuner.

According to the embodiment shown, tuning to a received signal is achieved by the use of a surface wave filter, as described above, whereupon the signal thus tuned is selectively withdrawn through a semiconductor switching device which is on/off controllable responsive to an on/off control voltage. Therefore, any problems encountered in conjunction with mechanical contacts in a conventional tuner and any necessity of complicated circuitry are totally eliminated. In particular, the fact that a signal of a desired channel can be selected among a plurality of signals as tuned responsive to a simple on/off control voltage of two levels using existing simple and reliable circuit components such as flip-flops, or the like brings about a considerable advantage in the field of television tuners. More specifically, considering a case as shown in FIG. 2, tuning voltages of twelve levels are required in order to select a desired signal among the received signals of twelve television channels in an electric manner, whereas according to the embodiment shown, such channel selection can be achieved by the use of twelve channel selection signals of only two-level control voltage, which may be of less precision. For these reasons, a television tuner of economy, reliability, versatility and productivity is provided. On the other hand, the quality factor Q of a surface wave filter can be selected with ease by selecting a piezoelectric material, an electrode pattern, and the like. Therefore, the freedom in designing with respect to the quality factor of a tuner as a whole can be increased. In addition, since the embodiment shown merely comprises surface waver filters, semiconductor switching devices and the like, a television tuner is simplified in structure, can be implemented in a solid state and can be made small sized. Since tuning is achieved using surface wave filters, a frequency alignment process after the assemblage of a tuner is not necessary, with the result of increased productivity.

Figure 7:
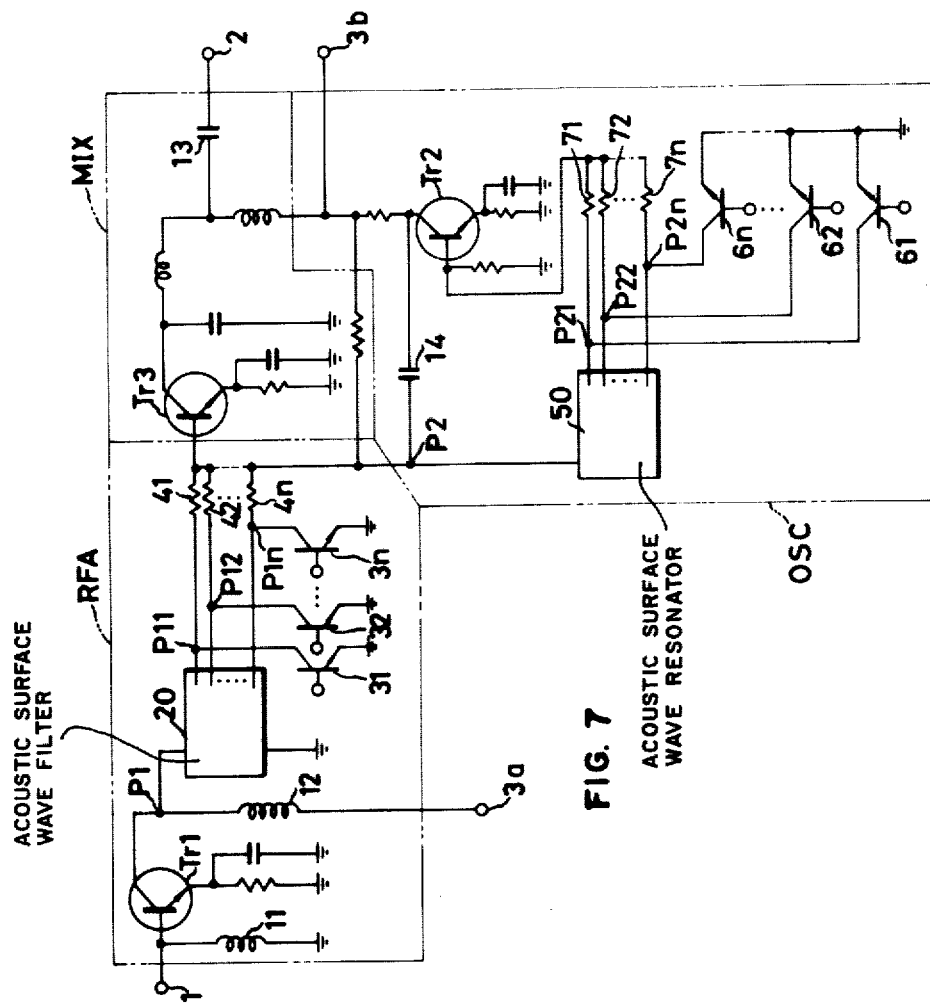
FIG. 7 shows a schematic diagram of another embodiment of the present invention.
Figure 8:
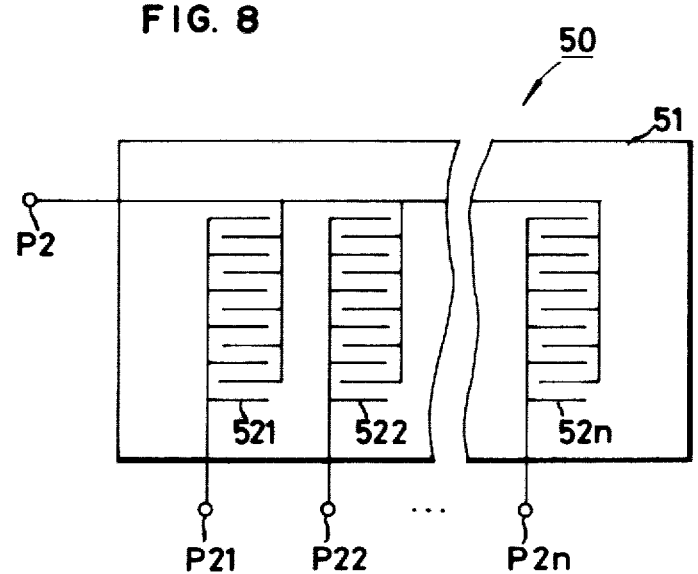
FIG. 8 shows a schematic diagram of another example of an acoustic surface wave apparatus for use in the present invention.

FIG. 7 shows a schematic diagram of another embodiment of the present invention wherein only the local oscillator OSC has been modified as compared with the FIG. 4 embodiment and therefore only the modified portion will be described in the following. Referring to FIG. 7, the local oscillator OSC comprises a local oscillating transistor Tr2 and an acoustic surface wave apparatus 50 including a group of acoustic surface wave resonators. The input terminal P2 of the acoustic surface wave apparatus 50 is connected to the base electrode of the mixing transistor Tr3 and is also connected to the collector electrode of the transistor Tr2 through a feedback capacitor 14. The acoustic surface wave apparatus 50 is structured as shown in FIG. 8. More specifically, the acoustic surface wave apparatus 50 comprises interdigital resonators 521, 522, 523, . . . 52n of the number (n) corresponding to the television channel number (n) formed on a piezoelectric body 51, as similar to the acoustic surface wave apparatus 20 shown in FIG. 5. The center to center spacing d' between electrode fingers of the respective resonators 521, 522, 523, . . . 52n is determined in association with a prescribed local oscillation frequency corresponding to each television channel. One electrode of each of the resonators 521, 522, 523, . . . 52n is commonly connected to the input terminal P2 and thus directly to the base electrode of the transistor Tr3. The other electrode of each of the resonators 521, 522, 523, . . . 52n is individually connected to a corresponding one of the output terminals P21, P22, P23, . . . P2n.

The output terminals P21, P22, P23, . . . P2n of the surface wave resonator group i.e. the surface wave apparatus 50 are coupled through resistors 71, 72, 73, . . . 7n, respectively, to the base electrode of the transistor Tr2. The resistors 71, 72, 73, . . . 7n, the transistor Tr2 and the capacitor 14 constitute a feedback path of the respective surface wave resonators 521, 522, 523, . . . 52n, such that oscillation occurs at each of the frequencies inherent to the resonator.

The output terminals P21, P22, P23, . . . P2n of the acoustic surface wave apparatus 50 are coupled through the semiconductor switching devices 61, 62, 63, . . . 6n, respectively, commonly to the ground. The semiconductor switching devices 61, 62, 63, . . . 6n may be implemented similarly to the semiconductor switching devices 31, 32, 33, . . . 3n in the high frequency amplifier RFA described previously, such that the switching voltage of each of terminals 841, 842, 843, . . . 84n of the channel selection circuit 80 shown in FIG. 6 is applied to the base electrode or the control electrode of each of the semiconductor switching devices 61, 62, 63, . . . 6n, respectively. An on/off control voltage of two levels is applied from the channel selection circuit 80 to these switching devices 61, 62, 63, . . . 6n, whereby a local oscillation frequency corresponding to a selected channel is selectively determined. Since the structure and operation of the other portions in the FIG. 7 embodiment are substantially the same as those described in conjunction with the FIG. 4 embodiment, it is not believed necessary to describe the same again in more detail.

It is pointed out that the present invention is not limited to the embodiment described previously but, as an alternative embodiment, surface wave devices and semiconductor switching devices may be employed only in the local oscillator OSC. With reference to FIG. 7, the surface wave filter group for the high frequency amplifier and the resonator group for the local oscillator may be formed on a common substrate. Alternatively, the surface wave filter group and the surface wave resonator group may be formed on separate substrates. Alternatively, each filter element in the filter group and a corresponding resonator element in the resonator group may be formed on a common substrate corresponding to each television channel. Formation of a filter group or a filter element and a resonator group or a resonator element on a common substrate makes uniform the temperature characteristics of both groups or elements, whereby temperature compensation can be achieved. It is further pointed out that the present invention can also be applied to a UHF tuner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A television tuner adapted for selecting a television signal among a plurality of televison channels, comprising means for selectively specifying a desired television channel, means operatively coupled to said channel specifying means for selectively receiving a high frequency television signal of a specified television channel, local oscillating means operatively coupled to said channel specifying means for providing an oscillation frequency signal the frequency of which is different by a given frequency difference from said received high frequency televison signal, and mixing means responsive to said received high frequency television signal and said local oscillation frequency signal for providing an intermediate frequency signal, said high frequency receiving means comprising:

a plurality of acoustic surface wave transducer means, each having a band pass characteristic corresponding to each said television channel for passing a corresponding high frequency signal, each said acoustic surface wave transducer means comprising interdigital electrode means formed on a body of piezoelectric material;

a plurality of semiconductor switching means operatively coupled to each said channel specifying means, each individually coupled to each said acoustic surface wave transducer means and adapted to be on/off controllable responsive to a channel specifying operation of said channel specifying means; and means for coupling each said semiconductor switching means in a parallel fashion between the output of each said corresponding acoustic surface wave transducer means and a reference potential means, each said semiconductor switching means being adapted to be normally turned on to shunt the respective high frequency television signal from the corresponding acoustic surface wave transducer means to the reference potential means and to be turned off responsive to a channel specifying operation of said channel specifying means to pass the respective high frequency television signals to said mixing means.

2. A television tuner in accordance with claim 1, wherein the output of each said acoustic surface wave transducer means is individually coupled through impedance means and commonly to the input of said mixing means.

3. A television tuner in accordance with claim 1, wherein said interdigital electrode means of each said acoustic surface wave transducer means is formed on a common body of piezoelectric material.

4. A television tuner in accordance with claim 1, wherein said high frequency television signal receiving means comprises means for amplifying a received high frequency television signal coupled to the input of each said acoustic surface wave transducer means.

5. A television tuner in accordance with claim 1, wherein said channel specifyng means comprises:
means for generating a channel specifying signal identifying a desired television channel, and
a plurality of storing means each operatively coupled to said channel specifying signal generating means for assuming one storing state responsive to said channel specifying signal.

6. A television tuner in accordance with claim 1, wherein inputs of said acoustic surface wave transducer means are coupled to commonly received a television signal.

7. A television tuner in accordance with claim 1, wherein inputs of said surface wave transducer means are spacially arranged to be coupled individually to the outputs of said acoustic surface wave transducer means.

8. A television tuner in accordance with claim 1, wherein each output of said acoustic surface wave transducer means comprises an interdigital electrode.

9. A television tuner in accordance with claim 1, wherein said semiconductor switching means are connected so that said interdigital electrodes corresponding to said television channels not selected are brought to the same potential level as said reference potential means.

10. A television tuner adapted for selecting a television signal among a plurality of television channels, comprising means for selectively specifying a desired television channel, means operatively coupled to said channel specifying means for selectively receiving a high frequency television signal of a specified television channel, local oscillating means operatively coupled to said channel specifying means for providing an oscillation frequency signal the frequency of which is different by a given frequency difference from said received high frequency television signal and mixing means responsive to said received high frequency television signal and said local oscillation frequency signal for providing an intermediate frequency signal, said local oscillating means comprising:

a plurality of acoustic surface wave resonator means, each having a resonance characteristic corresponding to each said television channel and comprising interdigital electrode means formed on a body of piezoelectric material;

feedback path means coupled between the output and the input of said plurality of acoustic surface wave resonator means;

a plurality of semiconductor switching means operatively coupled to said channel specifying means, each individually coupled to each said acoustic surface wave resonator means and adapted to be on/off controllable responsive to a channel specifying operation of said channel specifying means; and means for coupling each said semiconductor switching means in a parallel fashion between the output of each said corresponding acoustic surface wave resonator means and a reference potential means, each said semiconductor switching means being adapted to be normally turned on to shunt its corresponding acoustic surface wave resonator means to the reference potential means, and each of said semiconductor switching means being adapted to be turned off responsive to a channel specifying operation of said channel specifying means to generate said oscillation frequency signal for said mixing means.

11. A television tuner in accordance with claim 10, wherein the output of each said acoustic surface wave resonator means is individually coupled through impedance means and commonly to said feedback path means.

12. A television tuner in accordance with claim 10, wherein said interdigital electrode means of each said acoustic surface wave resonator means is formed on a common body of piezoelectric material.

13. A television tuner in accordance with claim 10, wherein said channel specifying means comprises:
means for generating a channel specifying signal identifying a desired television channel, and
a plurality of storing means each operatively coupled to said channel specifying signal generating means for assuming one storing state responsive to said channel specifying signal.

14. A television tuner in accordance with claim 10, wherein inputs of said acoustic surface wave resonator means are spacially arranged to be coupled individually to the inputs of said acoustic surface wave resonator means.

15. A television tuner in accordance with claim 10, wherein each output of said acoustic surface wave resonator means comprises an interdigital electrode.

16. A television tuner in accordance with claim 10, wherein said semiconductor switching means are connected so that said interdigital electrodes corresponding to said television channels not selected are brought to the same potential level as said reference potential means.

17. In a television tuner adapted for selecting a television signal among a plurality of television channels, including means for selectively specifying a desired television channel, means operatively coupled to said channel specifying means for selectively receiving a high frequency television signal for a specified television channel, local oscillation means operatively coupled to said channel specifying means for providing oscillation frequency signal the frequency of which is different by a given frequency difference from said received high frequency television signal, mixing means responsive to said received high frequency television signal and said local oscillation frequency signal for providing an intermediate frequency signal, and reference potential means, the improvement comprising:

circuit means for said high frequency receiving means including, a plurality of acoustic surface wave transducer means, each having a band pass characteristic corresponding to each said television channel for passing a corresponding high frequency signal, each said acoustic surface wave transducer means comprising interdigital electrode means formed on a body of piezoelectric material, and a plurality of semiconductor switching means, each connected in a parallel fashion between the output of each corresponding acoustic surface wave transducer means and said reference potential means, each said semiconductor switching means operatively coupled to said channel specifying means and adapted to be normally turned on to shunt the respective high frequency television signal from the corresponding acoustic surface wave transducer to the reference potential means and to be turned off responsive to a channel specifying operation of said channel specifying means to pass the respective high frequency television signals to said mixing means; and circuit means for said local oscillating means including, a plurality of acoustic surface wave resonator means, each having a resonance characteristic corresponding to each said television channel and comprising interdigital electrode means formed on a body of piezoelectric material, feedback path means coupled between the output and input of said plurality of acoustic surface wave resonator means, and a plurality of semiconductor switching means connected in parallel fashion between the output of each corresponding acoustic surface wave resonator means and said reference potential means, each said semiconductor switching means operatively coupled to said channel specifying means and adapted to be normally turned on to shunt its corresponding acoustic surface wave resonator means to the reference potential means, each of said semiconductor switching means being adapted to be turned off responsive to a channel specifying operation of said channel specifying means to generate said oscillation frequency for said mixing means.

18. A television tuner in accordance with claim 17, wherein all of said interdigital electrode means of each said acoustic surface wave transducer means and all of said interdigital electrode means of each said acoustic surface wave resonator means are formed on a common body of piezoelectric material.

19. A television tuner in accordance with claim 17, wherein said interdigital electrode means of each said acoustic surface wave transducer means corresponding to a particular channel and said interdigital electrode means of each said corresponding acoustic surface wave resonator means corresponding to said particular channel are formed on a common body of piezoelectric material associated with said television channel.

20. A television tuner in accordance with claim 17, wherein inputs of said acoustic surface wave transducer means are coupled to commonly receive a television signal.

21. A television tuner in accordance with claim 17, wherein inputs of said acoustic surface wave transducer means are spacially arranged to be coupled individually to the outputs of said acoustic surface wave transducer means; and inputs of said acoustic surface wave resonator means are spacially arranged to be individually coupled to the outputs of said acoustic surface wave resonator means.

* * * * *